United States Patent
Jian et al.

(10) Patent No.: US 10,396,040 B2
(45) Date of Patent: Aug. 27, 2019

(54) METHOD FOR FABRICATING ELECTRONIC PACKAGE HAVING A PROTRUDING BARRIER FRAME

(71) Applicant: Siliconware Precision Industries Co., Ltd., Taichung (TW)

(72) Inventors: Yue-Ying Jian, Taichung (TW); Wei-Ping Wang, Taichung (TW); Tsung-Ming Li, Taichung (TW); En-Li Lin, Taichung (TW); Kaun-I Cheng, Taichung (TW); Yu-De Chu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/975,380

(22) Filed: May 9, 2018

(65) Prior Publication Data

US 2018/0261552 A1    Sep. 13, 2018

Related U.S. Application Data

(62) Division of application No. 15/341,100, filed on Nov. 2, 2016, now Pat. No. 9,997,469.

(30) Foreign Application Priority Data

Aug. 5, 2016 (TW) .............................. 105124953 A

(51) Int. Cl.
*H01L 23/552* (2006.01)
*H01L 21/56* (2006.01)
(Continued)

(52) U.S. Cl.
CPC .......... *H01L 23/552* (2013.01); *H01L 21/565* (2013.01); *H01L 23/3121* (2013.01); *H01L 25/0655* (2013.01); *H01L 25/16* (2013.01); *H01L 25/50* (2013.01); *H01L 24/17* (2013.01); *H01L 24/48* (2013.01); *H01L 24/49* (2013.01); *H01L 2224/16225* (2013.01);
(Continued)

(58) Field of Classification Search
CPC ... H01L 23/552; H01L 23/556; H01L 21/565; H01L 25/0055; H01L 24/49
USPC ........................................ 257/659, 660, 723
See application file for complete search history.

(56) References Cited

U.S. PATENT DOCUMENTS

| 5,275,841 A | 1/1994 | Wong |
| 5,348,913 A | 9/1994 | McBride et al. |

(Continued)

*Primary Examiner* — Nitin Parekh
(74) *Attorney, Agent, or Firm* — Mintz Levin Cohn Ferris Glovsky and Popeo, P.C.; Peter F. Corless; Steven M. Jensen

(57) ABSTRACT

An electronic package is provided, which includes: a carrier; a plurality of electronic elements disposed on the carrier; a bather frame disposed on the carrier and positioned between adjacent two of the electronic elements; an encapsulant formed on the carrier and encapsulating the electronic elements and the bather frame with a portion of the bather frame protruding from the encapsulant; and a shielding element disposed on the encapsulant and being in contact with the portion of the bather frame protruding from the encapsulant. Therefore, the electronic package has an electromagnetic interference (EMI) shielding effect improved. The present disclosure further provides a method for fabricating the electronic package.

8 Claims, 4 Drawing Sheets

(51) Int. Cl.
   *H01L 23/31*      (2006.01)
   *H01L 25/065*     (2006.01)
   *H01L 25/16*      (2006.01)
   *H01L 25/00*      (2006.01)
   *H01L 23/00*      (2006.01)

(52) U.S. Cl.
   CPC ............... *H01L 2224/48091* (2013.01); *H01L 2224/48106* (2013.01); *H01L 2224/48225* (2013.01); *H01L 2924/01013* (2013.01); *H01L 2924/01028* (2013.01); *H01L 2924/01029* (2013.01); *H01L 2924/01079* (2013.01); *H01L 2924/1421* (2013.01); *H01L 2924/3025* (2013.01)

(56) References Cited

U.S. PATENT DOCUMENTS

| | | |
|---|---|---|
| 5,436,203 A | 7/1995 | Lin |
| 5,907,477 A | 5/1999 | Tuttle et al. |
| 5,973,923 A | 10/1999 | Jitaru |
| 6,934,065 B2 | 8/2005 | Kinsman |
| 7,049,682 B1 * | 5/2006 | Mathews ............... H01L 23/552 257/659 |
| 8,928,129 B2 * | 1/2015 | Song ..................... H01L 23/552 257/531 |
| 9,040,408 B1 | 5/2015 | Zhou et al. |
| 10,242,957 B2 * | 3/2019 | Kim ........................ H01L 23/60 |
| 2002/0189832 A1 | 12/2002 | Baba et al. |
| 2009/0194851 A1 * | 8/2009 | Chiu ....................... H01L 21/568 257/660 |
| 2010/0320482 A1 | 12/2010 | Tachibana |
| 2011/0006408 A1 * | 1/2011 | Liao ....................... H01L 21/561 257/660 |
| 2011/0298109 A1 * | 12/2011 | Pagaila ................... H01L 21/56 257/660 |
| 2012/0112328 A1 * | 5/2012 | Pagaila ................. H01L 21/561 257/660 |
| 2013/0037831 A1 | 2/2013 | Rudmann et al. |
| 2014/0151868 A1 | 6/2014 | Bayerer |
| 2014/0239464 A1 * | 8/2014 | Chung ................... H02L 23/60 257/659 |
| 2016/0043039 A1 * | 2/2016 | Lakshminarayan .. H01L 23/552 257/659 |
| 2016/0172309 A1 * | 6/2016 | Gong ....................... H01L 24/97 257/659 |

* cited by examiner

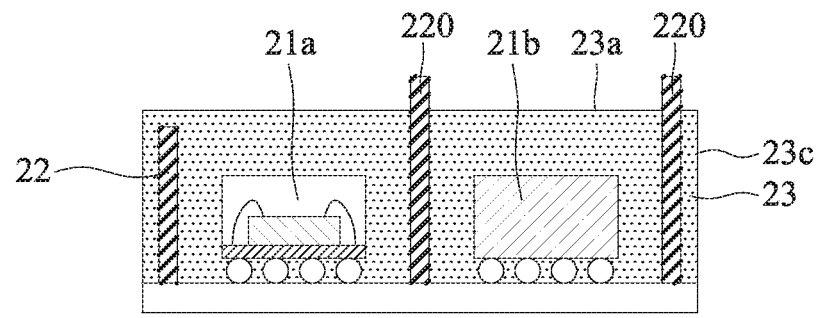
FIG. 2C
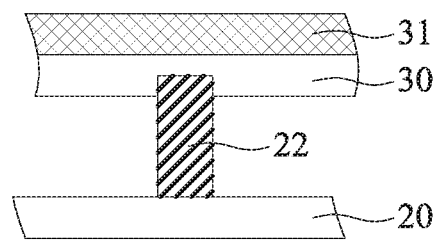
FIG. 2C'
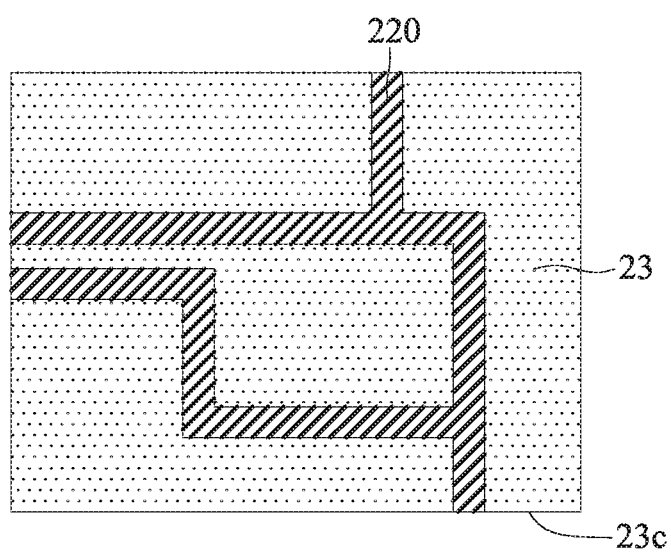
FIG. 2C"

METHOD FOR FABRICATING ELECTRONIC PACKAGE HAVING A PROTRUDING BARRIER FRAME

CROSS-REFERENCE TO RELATED APPLICATION(S)

This application is a divisional of copending application U.S. Ser. No. 15/341,100, filed on Nov. 2, 2016, which claims under 35 U.S.C. § 119(a) the benefit of Taiwanese Application No. 105124953, filed Aug. 5, 2016, the entire contents of which are incorporated herein by reference.

BACKGROUND

1. Technical Field

The present disclosure relates to electronic packages, and, more particularly, to an electronic package capable of preventing electromagnetic interference and a method for fabricating the electronic package.

2. Description of Related Art

Along with the rapid development of semiconductor technologies, various types of packages have been developed for semiconductor products. To improve the electrical performance, many semiconductor products have a shielding function to prevent electromagnetic interference (EMI).

FIGS. 1A to 1C are schematic cross-sectional views showing a method for fabricating an RF module 1 according to the prior art. Referring to FIG. 1A, a plurality of RF chips 11a, 11b and non-RF electronic elements 11 are disposed on and electrically connected to a substrate 10. Then, referring to FIG. 1B, an encapsulant 13 made of an epoxy resin, for example, is formed to encapsulate the RF chips 11a, 11b and non-RF electronic elements 11. Thereafter, referring to FIG. 1C, a metal film 14 is formed on the encapsulant 13. As such, the encapsulant 13 protects the RF chips 11a, 11b, the non-RF electronic elements 11 and the substrate 10 against intrusion of external moisture or contaminants, and the metal film 14 protects the RF chips 11a, 11b from being adversely affected by external EMI.

However, the metal film 14 cannot prevent EMI from occurring between the RF chips 11a, 11b. As such, a signal error may occur.

Therefore, how to overcome the above-described drawbacks has become critical.

SUMMARY

In view of the above-described drawbacks, the present disclosure provides an electronic package, which comprises: a carrier; a plurality of electronic elements disposed on the carrier; a barrier frame disposed on the carrier and positioned between adjacent two of the electronic elements; an encapsulant formed on the carrier and encapsulating the electronic elements and the barrier frame with a portion of the barrier frame protruding from the encapsulant; and a shielding element disposed on the encapsulant and being in contact with the portion of the barrier frame protruding from the encapsulant.

The present disclosure further provides a method for fabricating an electronic package, which comprises: disposing a plurality of electronic elements and a barrier frame on a carrier with the barrier frame positioned between adjacent two of the electronic elements; forming on the carrier an encapsulant encapsulating the electronic elements and the barrier frame with a portion of the barrier frame protruding from the encapsulant; and disposing a shielding element on the encapsulant with the shielding element being in contact with the portion of the barrier frame protruding from the encapsulant.

In an embodiment, the method further comprises, prior to forming the encapsulant, covering the barrier frame with a release film, and, after forming the encapsulant, removing the release film.

In an embodiment, the electronic elements can be active elements, passive elements, package structures, or any combination thereof.

In an embodiment, the barrier frame is made of a conductive material.

In an embodiment, the shielding element is a conductive layer formed by sputtering on the encapsulant. In another embodiment, the shielding element is a conductive cover disposed on the encapsulant.

In an embodiment, an insulating layer is further formed to encapsulate the shielding element.

According to the present disclosure, the barrier frame is disposed between adjacent electronic elements, and a portion of the barrier frame protrudes from the encapsulant and is in contact with the shielding element. As such, the shielding element and the portion of the barrier frame that protrudes from the encapsulant form a shielding structure around the electronic elements, thereby effectively preventing EMI from occurring between the electronic elements and also preventing external EMI from adversely affecting internal circuits of the electronic elements.

BRIEF DESCRIPTION OF DRAWINGS

FIGS. 2A to 2D are schematic cross-sectional views showing a method for fabricating an electronic package according to the present disclosure, wherein FIG. 2B' is a schematic upper view showing an arrangement of the components of FIG. 2B, FIG. 2C' is a partially enlarged view of a processing step in FIG. 2C, and FIG. 2C" is a schematic upper view showing a process performed after the process of FIG. 2B'.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all disclosure the drawings are not intended to limit the present disclosure. Various modifications and variations can be made without departing from the spirit of the present disclosure. Further, terms such as "upper", "top", "bottom", "side", "a" etc. are merely for illustrative purposes and should not be construed to limit the scope of the present disclosure.

FIGS. 2A to 2D are schematic cross-sectional views showing a method for fabricating an electronic package 2 according to the present disclosure.

Figure 1A:
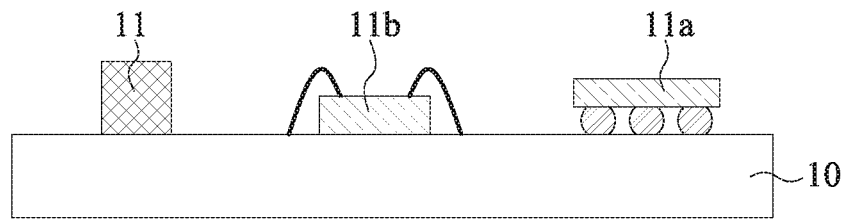
FIGS. 1A to 1C are schematic cross-sectional views showing a method for fabricating an RF module according to the prior art.
Figure 1B:
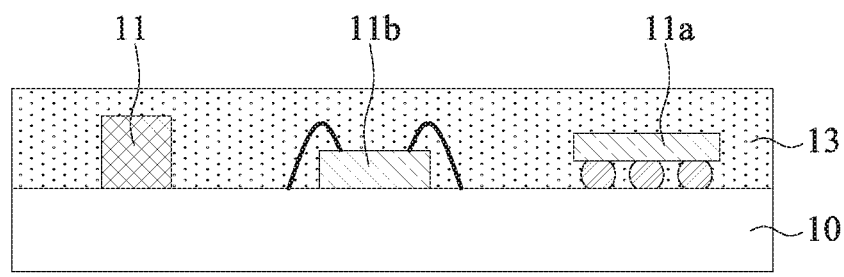
Figure 1C:
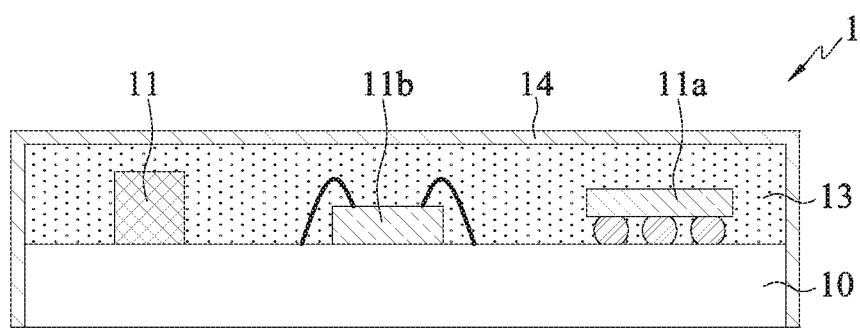
Figure 2A:
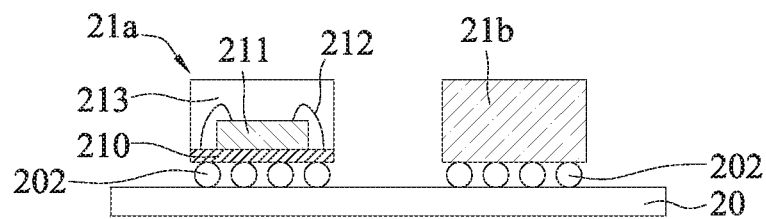

Referring to FIG. 2A, a carrier 20 is provided, and a plurality of electronic elements 21a, 21b are disposed on the carrier 20 and electrically connected to the carrier 20 through a plurality of solder balls 202.

The carrier 20 is a core or coreless circuit board having a plurality of conductive pads (not shown) and at least one grounding portion (not shown). Further, the carrier 20 has, for example, at least one internal circuit (not shown) optionally electrically connected to the conductive pads and the grounding portion.

At least one of the electronic elements 21a is a package structure, and at least one of the electronic elements 21b is an active element such as a semiconductor chip, a passive element, such as a resistor, a capacitor or an inductor, or a combination thereof. In an embodiment, the electronic element 21a has a packaging substrate 210 electrically connected to the carrier 20, a chip 211 disposed on the packaging substrate 210 and electrically connected to the packaging substrate through bonding wires 212 or solder bumps (not shown), and an encapsulant 213 encapsulating the chip 211 and the bonding wires 212.

In an embodiment, the electronic element 21b is a flip chip, and is electrically connected to the conductive pads of the carrier 20 through a plurality of solder balls 202. In another embodiment, the electronic element 21b is a wire-bonding chip, and is electrically connected to the conductive pads of the carrier 20 through a plurality of bonding wires.

In an embodiment, the electronic elements 21a, 21b are RF modules, such as WLAN, GPS, Bluetooth, DVB-H and FM wireless communication modules.

Figure 2B:
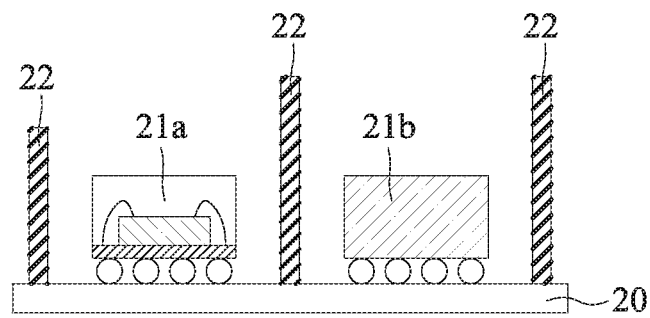
Figure 2B:
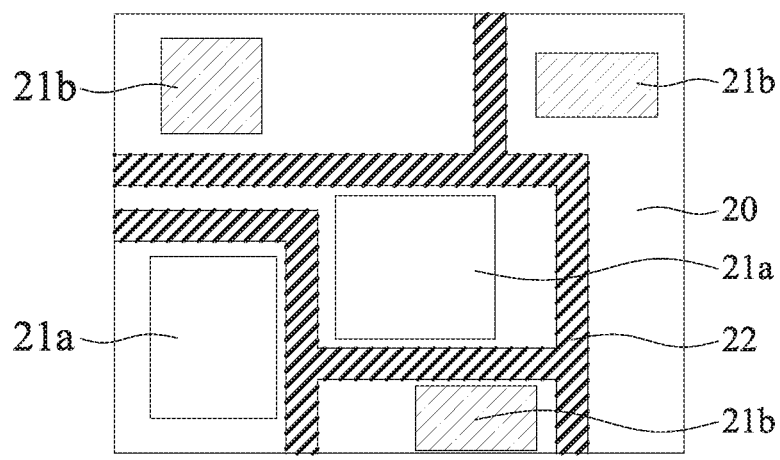

Referring to FIG. 2B, at least one barrier frame 22 is disposed between the electronic elements 21a, 21b.

In an embodiment, the bather frame 22 is made of a conductive material, such as Cu, Au, Ni or Al. The barrier frame 22 is vertically disposed on the carrier 20 and positioned between the electronic elements 21a, 21b to cover sides of the electronic elements 21a, 21b and prevent EMI from occurring between the electronic elements 21a, 21b. As such, the electronic elements 21a, 21b can function properly.

The barrier frame 22 can have a uniform height (not shown) or a non-uniform height (as shown in FIG. 2B) according to the practical need.

FIG. 2B' is a schematic upper view showing an arrangement of the barrier frame 22 and the electronic elements 21a, 21b. Referring to FIG. 2B', the arrangement of the bather frame 22 and the electronic elements 21a, 21b can be determined according to the practical need.

Referring to FIG. 2C, an encapsulant 23 is formed on the carrier 20 to encapsulate the bather frame 22 and the electronic elements 21a, 21b. The encapsulant 23 has a top surface 23a lower than a portion of an end of the bather frame 22 so as to allow the portion of the end of the barrier frame 22 to protrude from the encapsulant 23, thus forming a protruding portion 220 exposed from the encapsulant 23.

In an embodiment, the encapsulant 23 is formed by molding. The encapsulant 23 can protect the electronic elements against environment pollution, oxidization or damage.

Referring to FIG. 2C', during the molding process, a release film 30 is provided between a mold 31 and the bather frame 22 to cover the bather frame 22. After the encapsulant 23 is formed, the mold 31 and the release film 30 are removed so as to allow a portion of the barrier frame 22 covered by the release film 30 to protrude from a molding surface (i.e., top surface 23a) of the encapsulant 23.

In an embodiment, referring to FIG. 2C''', the bather frame 22 is flush with a side surface 23c of the encapsulant 23. In another embodiment, the barrier frame 22 protrudes from the side surface 23c of the encapsulant 23.

Figure 2D:
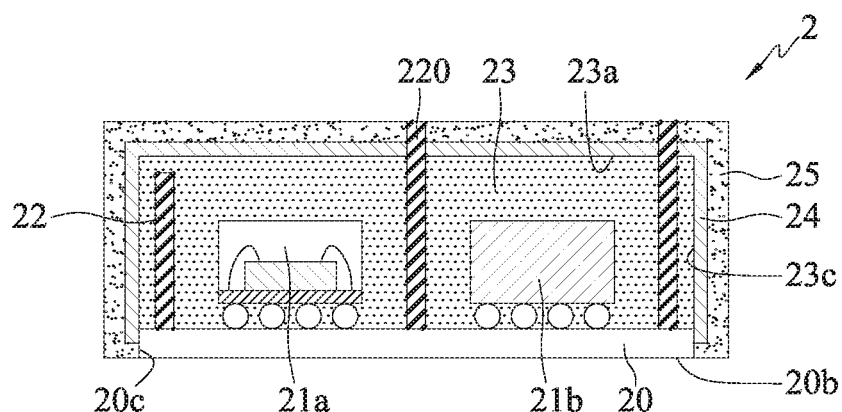

Referring to FIG. 2D, a shielding element 24 is in contact with the protruding portions 220 of the barrier frame 22.

In an embodiment, the shielding element 24 is made of a conductive material such as metal or a conductive adhesive. In an embodiment, the shielding element 24 is formed as a conductive layer (or a shielding layer) on the top surface 23a and the side surface 23c of the encapsulant 23 by sputtering. In an embodiment, the shielding element 24 is not formed on a bottom surface 20b of the carrier 20. In another embodiment, a conductive cover is disposed on the encapsulant 23 to serve as the shielding element 24.

In an embodiment, the shielding element 24 extends on a portion of a side surface 20c of the carrier 20 so as to come into contact with the grounding portion of the carrier 20. As such, both the shielding element 24 and the bather frame 22 have a grounding function. In another embodiment, the bather frame 22 can be in contact with the grounding portion of the carrier 20 so as to allow the shielding element 24 and the bather frame 22 to have a grounding function.

Furthermore, an insulating layer 25 is optionally formed on the shielding element 24 and the side surface 20c of the carrier 20 to encapsulate the shielding element 24 and the protruding portions 220 of the barrier frame 22. In another embodiment, the insulating layer 25 is not formed on the bottom surface 20b of the carrier 20. In an embodiment, the protruding portions 220 of the barrier frame 22 is be exposed from the insulating layer 25 (as shown in FIG. 2D) or not.

According to the present disclosure, a portion of the barrier frame 22 (i.e., the protruding portion 220) protrudes from the encapsulant 23 and comes into contact with the shielding element 24. As such, the shielding element 24 and the protruding portion 220 of the bather frame 22 form a shielding structure around the electronic elements 21a, 21b, thereby effectively preventing EMI from occurring between the electronic elements 21a, 21b and also preventing external EMI from adversely affecting internal circuits of the electronic elements 21a, 21b.

Further, since the encapsulant 23 is formed with its top surface lower than a portion of the barrier frame 22 so as to allow the portion of the barrier frame 22 to protrude from the encapsulant 23 after formation of the encapsulant 23, the present disclosure eliminates the need to form openings in the encapsulant 23 for exposing the portion of the bather frame 22.

Furthermore, since the shielding element 24 is disposed on the encapsulant 23, the present disclosure does not need to consider the circuit arrangement of the carrier 20, thus simplifying the fabrication process, saving the fabrication time and reducing the fabrication cost.

The present disclosure further provides an electronic package 2, which has: a carrier 20; a plurality of electronic elements 21a, 21b disposed on the carrier 20; at least one bather frame 22 disposed on the carrier 20 and positioned between adjacent two of the electronic elements 21a, 21b; an encapsulant 23 formed on the carrier 20 and encapsulating the electronic elements 21a, 21b and the bather frame 22, wherein a portion of the barrier frame 22 protrudes from the encapsulant 23; and a shielding element 24 disposed on the encapsulant 23 and in contact with the portion of the barrier frame 22 that protrudes from the encapsulant 23.

In an embodiment, at least one of the electronic elements 21a, 21b is an active element, a passive element or a package structure.

In an embodiment, the barrier frame 22 is made of a conductive material.

In an embodiment, the shielding element 24 is a conductive layer formed on the encapsulant 23.

In an embodiment, the shielding element 24 is a conductive cover disposed on the encapsulant 23.

In an embodiment, the electronic package 2 further comprises an insulating layer 25 encapsulating the shielding element 24.

Therefore, the present disclosure allows a portion of the barrier frame to protrude from the encapsulant and be in contact with the shielding element so as to form a shielding structure, thereby effectively preventing EMI from occurring between the electronic elements and also preventing external EMI from adversely affecting the internal circuits of the electronic elements.

The above-described descriptions of the detailed embodiments are only to illustrate the implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A method for fabricating an electronic package, comprising:

disposing a plurality of electronic elements and a barrier frame on a carrier with the barrier frame positioned between adjacent two of the plurality of electronic elements;

forming on the carrier an encapsulant encapsulating the plurality of electronic elements and the barrier frame with a portion of the barrier frame protruding from the encapsulant; and disposing a shielding element on the encapsulant with the shielding element being in contact with the portion of the barrier frame protruding from the encapsulant.

2. The method of claim 1, wherein the plurality of electronic elements are active elements, passive elements, package structures or any combination thereof.

3. The method of claim 1, wherein the barrier frame is made of a conductive material.

4. The method of claim 1, further comprising, prior to forming the encapsulant, partially covering the barrier frame with a release film.

5. The method of claim 4, further comprising, after forming the encapsulant, removing the release film.

6. The method of claim 1, wherein the shielding element is a conductive layer formed by sputtering on the encapsulant.

7. The method of claim 1, wherein the shielding element is a conductive cover disposed on the encapsulant.

8. The method of claim 1, further comprising forming an insulating layer encapsulating the shielding element.

* * * * *